United States Patent
Wu et al.

(10) Patent No.: US 9,563,082 B2
(45) Date of Patent: Feb. 7, 2017

(54) DISPLAY PANEL AND DISPLAY DEVICE COMPRISING THE SAME

(71) Applicant: InnoLux Corporation, Miao-Li County (TW)

(72) Inventors: Cheng-Min Wu, Miao-Li County (TW); Chia-Lin Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/937,913

(22) Filed: Nov. 11, 2015

(65) Prior Publication Data

US 2016/0147096 A1    May 26, 2016

(30) Foreign Application Priority Data

Nov. 20, 2014   (TW) .............................. 103140183 A

(51) Int. Cl.
G06F 1/16 (2006.01)
G02F 1/1339 (2006.01)
G02F 1/1333 (2006.01)
G02F 1/1345 (2006.01)
H01L 51/52 (2006.01)
H01L 27/32 (2006.01)

(52) U.S. Cl.
CPC ......... *G02F 1/1339* (2013.01); *G02F 1/13452* (2013.01); *G02F 1/133345* (2013.01); *H01L 51/5246* (2013.01); *H01L 27/3276* (2013.01); *H01L 51/5243* (2013.01)

(58) Field of Classification Search
CPC ............ G02F 1/13392; G02F 1/133345; G06F 1/1656
See application file for complete search history.

(56) References Cited

U.S. PATENT DOCUMENTS 8,755,016 B2 * 6/2014 Song ..................... G02F 1/1339
349/139

FOREIGN PATENT DOCUMENTS

CN       202149999 U    2/2012
CN       102830550 A    12/2012

* cited by examiner

*Primary Examiner* — Anthony Q Edwards
(74) *Attorney, Agent, or Firm* — Bacon & Thomas, PLLC

(57) ABSTRACT

A display panel and a display device comprising the same are disclosed. The display panel of the present invention comprises: a first substrate comprising a display region and a border region surrounding the display region, wherein a plurality of circuits are disposed on the border region, and an insulating layer is disposed on the first substrate and covers the circuits; a second substrate; a conductive unit disposed on the insulating layer, and partially overlapping with the circuits; and a sealant disposed between the first substrate and the second substrate, and covering the conductive unit, wherein the sealant comprises a plurality of conductive particles dispersed therein.

12 Claims, 3 Drawing Sheets

DISPLAY PANEL AND DISPLAY DEVICE COMPRISING THE SAME

CROSS REFERENCE TO RELATED APPLICATION

This application claims the benefits of the Taiwan Patent Application Serial Number 103140183, filed on Nov. 20, 2014, the subject matter of which is incorporated herein by reference.

BACKGROUND OF THE INVENTION

1. Field of the Invention

The present invention relates to a display panel and a display device comprising the same and, more particularly, to a display panel and a display device comprising the same in which the panel damage causing by the point discharge occurred at the conductive particles in the sealant during the electrostatic discharge test can be prevented.

2. Description of Related Art

In recent years, all the display devices are developed toward having small volume, thin thickness and light weight as the display techniques progresses. A liquid crystal display (LCD) device is a flat panel display device with a thin thickness, so a conventional cathode ray tube (CRT) display is gradually replaced by the LCD device. Especially, the LCD device can be applied to various fields. For example, the daily used devices such as cell phones, notebooks, video cameras, cameras, music players, navigation devices, and televisions are equipped with liquid crystal display (LCD) panels.

In all the aforementioned display devices, an electrostatic discharge test (ESD test) has to be performed thereon before delivery, to evaluate the circuit damage causing by the static electricity from operators or machines during the transportations or operations of the products, and also to confirm that whether the product can satisfy the internal and international standard of the compatibility test or not.

In the conventional display panel, the conductive particles are usually dispersed in the sealant, and point discharge may be occurred at these conductive particles during the electrostatic discharge test, resulting in the damage of the circuits. Therefore, it is desirable to provide a display panel, wherein the damage of the circuits causing by the point discharge occurred at these conductive particles can be prevented, to further improve the reliability of the obtained display panel.

SUMMARY OF THE INVENTION

The object of the present invention is to provide a display panel and a display device comprising the same, wherein the panel damage causing by the point discharge occurred at the conductive particles in the sealant during the electrostatic discharge test can be prevented.

To achieve the object, the display panel of the present invention comprises: a first substrate comprising a display region and a border region surrounding the display region, wherein a plurality of circuits are disposed on the border region, and an insulating layer is disposed on the first substrate and covers the circuits; a second substrate opposite to the first substrate; a conductive unit disposed on the insulating layer and the border region of the first substrate, and partially overlapping with the circuits; and a sealant disposed between the first substrate and the second substrate and on the border region of the first substrate, and covering the conductive unit, wherein the sealant comprises a plurality of conductive particles dispersed therein.

In the display panel of the present invention, the conductive unit is preferably electrically insulated with the circuits. More preferably, the conductive unit is a floating conductive layer.

In the display panel of the present invention, the conductive unit may partially overlap with the circuits; and preferably, the conductive unit covered by the sealant completely overlaps with the circuits.

In the display panel of the present invention, the type of the conductive unit is not particularly limited, and the conductive unit can be a plate conductive layer or a patterned conductive layer, as long as the conductive unit partially overlaps with the circuits. When the conductive unit is a patterned conductive layer, the patterned conductive layer preferably is disposed to be corresponded to the circuits.

In the display panel of the present invention, the material for the conductive unit is not particularly limited, as long as it is a conductive material such as metals or transparent conductive oxides. Preferably, the conductive unit is made of a transparent conductive oxide.

In the display panel of the present invention, the material for the conductive particles in the sealant is not particularly limited, as long as it is a conductive material. Preferably, the conductive particles are respectively a metal particle, such as an Au ball or an Ag ball.

In the display panel of the present invention, the thickness of the insulating layer is not particularly limited, as long as the insulating layer can completely cover the circuits. Preferably, the thickness of the insulating layer is 200-450 nm.

In the display panel of the present invention, the conductive particles are randomly dispersed in the sealant, and parts of the conductive particles directly contact with the conductive unit.

Furthermore, the present invention further provides a display device comprising the aforementioned display panel.

Other objects, advantages, and novel features of the invention will become more apparent from the following detailed description when taken in conjunction with the accompanying drawings.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1

Figure 1:
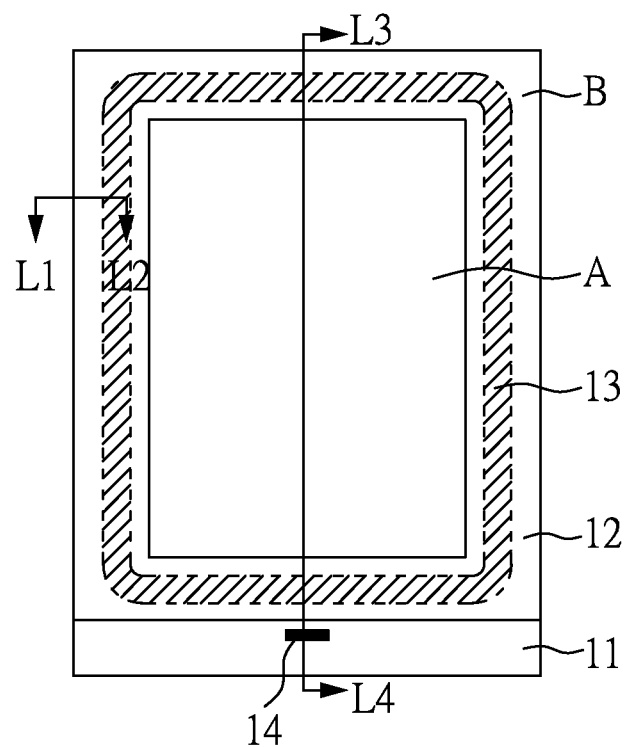
FIG. 1 is a perspective view of a display panel according to Embodiment 1 of the present invention.
Figure 2:
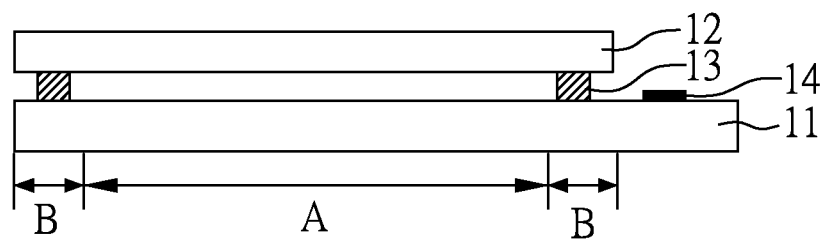
FIG. 2 is a cross-sectional view of a display panel according to Embodiment 1 of the present invention.

FIGS. 1 and 2 are respectively a top view and a cross-sectional view of the display panel of the present embodiment, wherein FIG. 2 is a cross-sectional view of the display panel along line L3-L4 in FIG. 1. As shown in FIG. 2, the manufacturing process for the display panel of the present embodiment comprises: providing a first substrate 11 and a second substrate 12; and assembling the first substrate 11 and the second substrate 12 with a sealant 13. After the aforementioned process, the obtained display panel of the present invention comprises: a first substrate 11 comprising a display region A and a border region B surrounding the display region A; a second substrate 12 opposite to the first substrate 11; and a sealant 13 disposed between the first substrate 11 and the second substrate 12 and on the border region B of the first substrate 11. In addition, a terminal unit 14 is further disposed on the first substrate 11 uncovered with the second substrate 12.

In the present embodiment, a medium layer can be disposed in the space between the first substrate 11 and the second substrate 12. For example, the space between the first substrate 11 and the second substrate 12 can be filled with liquid crystal molecules, and the obtained display panel is a liquid crystal display panel. Herein, the first substrate 11 can be a thin film transistor substrate with thin film transistor units formed thereon and the second substrate 12 can be a color filter substrate comprising a color filter layer and a black matrix layer; or the first substrate 11 can be a color filter on array (COA) substrate with both the thin film transistor units and the color filter layer formed thereon and the second substrate 12 is a counter substrate with the black matrix layer formed thereon. Alternatively, in other embodiment of the present invention, organic light emitting diode units may be disposed on the first substrate 11 and between the first substrate 11 and the second substrate 12, to form an organic light emitting diode display panel. In this case, the first substrate 11 can be a thin film transistor substrate with thin film transistor units formed thereon and the second substrate 12 and the second substrate 12 can be a counter substrate comprising a black matrix layer and selectively comprising a color filter layer. In the present invention, the structures of the first substrate 11 and the second substrate 12 are known in the field of liquid crystal display devices or organic light emitting diode display devices, and the detail structures thereof are not illustrated herein. Furthermore, the first substrate 11 and the second substrate 12 can be made of any material generally used for the substrate, for example, glass, plastic and other material for forming flexible substrates.

Figure 3:
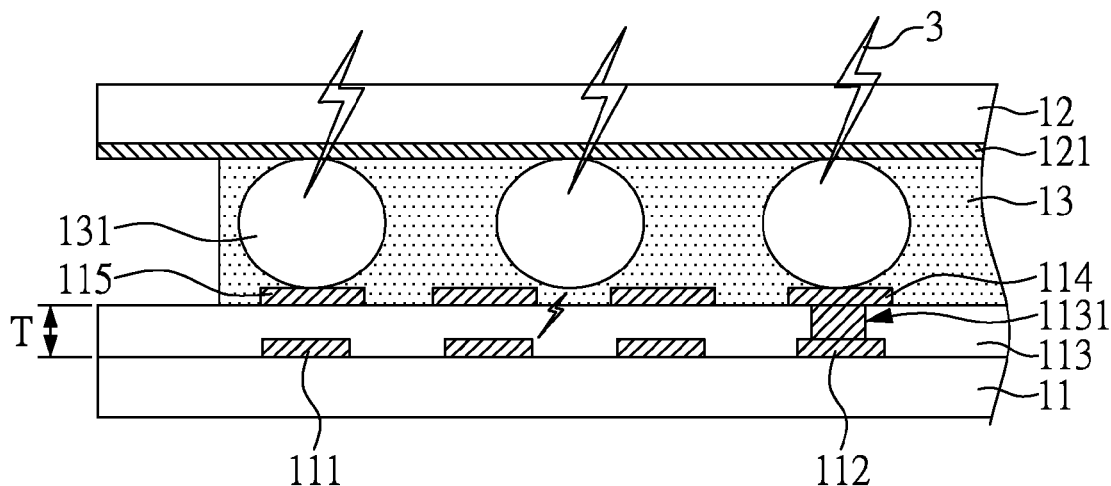
FIG. 3 is a perspective view showing a part of a border region of a display panel according to Embodiment 1 of the present invention.

Hereinafter, the structure of the border region B of the display panel in the present embodiment is illustrated in detail. As shown in FIGS. 1 and 3, wherein FIG. 3 is a cross-sectional view of the display panel along line L1-L2 in FIG. 1, the display panel of the present embodiment comprises: a first substrate 11 comprising a display region A and a border region B surrounding the display region A, wherein the plurality of circuits 111, 112 are disposed on the border region B of the first substrate 11, and an insulating layer 113 is disposed on the first substrate 11 and covers the circuits 111, 112; a second substrate 12 opposite to the first substrate 11; a conductive unit 115 disposed on the insulating layer 113 and on the border region B of the first substrate 11, and partially overlapping with the circuits 111; and a sealant 13 disposed between the first substrate 11 and the second substrate 12 and also on the border region B of the first substrate 11, and covering the conductive unit 115, wherein the sealant 13 comprises a plurality of conductive particles 131 dispersed therein.

As shown in FIG. 3, in the present embodiment, the insulating layer 113 has a contact via 1131 penetrating through the insulating layer 113, and an electrode layer 114 is disposed on the insulating layer 113 and extending to the contact via 1131 to electrically connect with the circuit 112. In addition, the circuits 111 and the circuit 112 electrically connect to the terminal unit 14 (shown in FIG. 1), and the circuits 111 also electrically connect to circuits in the display region (not shown in the figure). Furthermore, another electrode layer 121 is disposed on the second substrate 12. Hence, the potential of the electrode layer 121 on the second substrate 12 can be conducted to the electrode layer 114 on the first substrate 11 through the disposition of the conductive particles 131 in the sealant 13. In the present embodiment, the conductive particles 131 are dispersed in the sealant 13. The material for the conductive particles 131 is not particularly limited, and can be metal particles such as Au balls and Ag balls. In addition, the sizes of the conductive particles 131 are also not particularly limited, and can be adjusted according to the gap between the electrode layer 121 on the second substrate 12 and the electrode layer 114 on the first substrate 11.

As shown in FIG. 3, in the present embodiment, the conductive unit 115 is not only disposed on the insulating layer 113, but also electrically insulated with the circuits 111. Preferably, the conductive unit 115 is a floating conductive layer. The disposition of the conductive unit 115 can prevent the panel damage causing by the point discharge occurred at the conductive particles 131 in the sealant 13 during the electrostatic discharge test. However, in another case, the conductive unit 115 may electrically connect to the electrode layer 121 on the second substrate 12 through the conductive particles 131, but the conductive unit 115 is still electrically insulated with the circuits 111; therefore, the circuits 111 can be protected against the point discharge occurred at the conductive particles 131 during the electrostatic discharge test.

More specifically, as shown in FIG. 3, the conductive particles 131 in the sealant 13 can be considered as tiny conductors. Hence, during the electrostatic discharge test performed after the display panel of the present embodiment is obtained, point discharge may be occurred at the conductive particles 131 when static electricity is applied thereon. In this case, the point discharge occurred at the conductive particles 131 cannot be conducted and may cause the circuits 111 near to the conductive particles 131 damaged, resulting in the panel damage. Hence, in the present embodiment, the conductive unit 115 overlaps with the circuits 111, so the charges generated by the point discharge occurred at the conductive particles 131 can be conducted to the conductive unit 115 and then dispersed out. More particularly, in the present embodiment, some conductive particles 131 directly contact with the conductive unit 115, so the charges generated at the conductive particles 131 can be transmitted to the conductive unit 115 and then dispersed out, preventing the circuits 111 near to the conductive particles 131 from being damaged by the point discharge occurred at the conductive particles 131. Meanwhile, the conductive unit 115 is disposed only on the border region B (as shown in FIG. 2), but not on the display region A (as shown in FIG. 2). That is, the conductive unit 115 does not electrically connect to but is electrically isolated with the circuits in the display region. Hence, even though the point discharge is occurred at the conductive particles 131, the charges from the point discharge do not reduce the display quality of the display region.

In the present embodiment, the aforementioned effect can be obtained when the conductive unit 115 is partially overlapped with the circuits 111. However, in order to improve the protection effect of the conductive unit 115, preferably, the conductive unit 115 covered by the sealant 13 completely overlaps with the circuits. Herein, the shapes of the conductive unit 115 is not particularly limited, as long as the conductive unit 115 is partially or completely overlapped with the circuits 111. In the present embodiment, the conductive unit 115 is a patterned conductive layer, and the patterned conductive layer is disposed to be corresponded to the circuits 111.

In addition, in the present embodiment, a thickness of the insulating layer 113 is 200-450 nm. Since the display panel of the present embodiment is disposed with the conductive unit 115, the damage of the circuits 111 caused by the point discharge occurred at the conductive particles 131 can be prevented, even though the thickness of the insulating layer 113 is only 200-450 nm and not particularly thickened. In addition, comparing with the conventional display panel having thickened insulating layer 113 to prevent the damage of the circuits 111 caused by the point discharge, the thickness of the insulating layer 113 in the present embodiment is not particularly thickened, resulting in the reduction of manufacturing process and cost of the display panel of the present embodiment.

In the present embodiment, the material for the conductive unit 115 is not particularly limited, as long as it is a conductive material. Preferably, the material of the conductive unit 115 is a transparent conductive oxide, such as ITO and IZO. In addition, in the present embodiment, the electrode layer 114 on the first substrate 11 and the electrode layer 121 on the second substrate 12 can be made of any electrode material generally used in the art, such as the aforementioned transparent conductive oxide. When the electrode layer 114 on the first substrate 11 and the conductive unit 115 are made of identical material both of them can be formed in the same process, to reduce the complexity of the manufacturing process.

Embodiment 2

Figure 4:
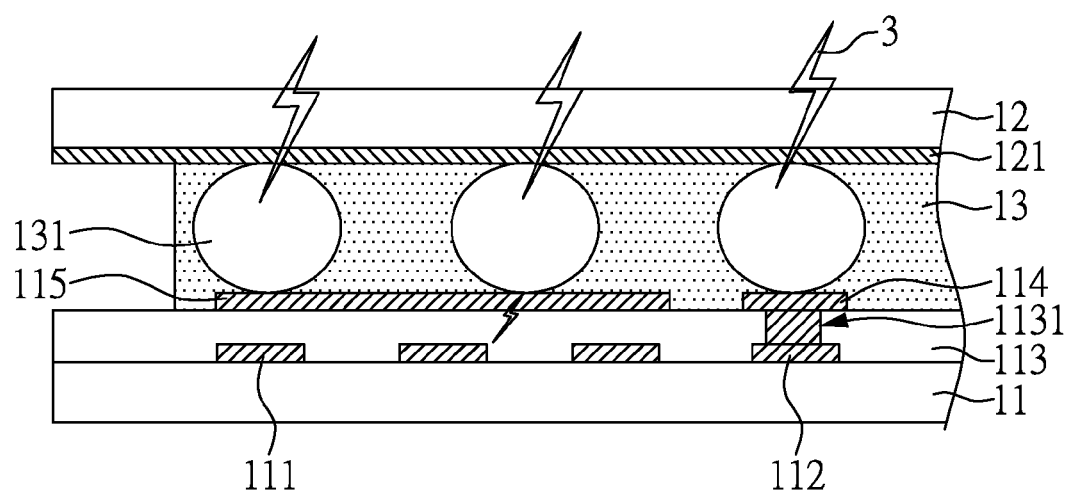
FIG. 4 is a perspective view showing a part of a border region of a display panel according to Embodiment 2 of the present invention.

FIG. 4 is a perspective view showing a part of a border region of a display panel in the present embodiment. The manufacturing process and the structure of the display panel of the present embodiment are identical to those illustrated in Embodiment 1, except that the conductive unit 115 in Embodiment 1 is a patterned conductive layer, and the conductive unit 115 in the present embodiment is a plate conductive layer.

Embodiment 3

Figure 5:
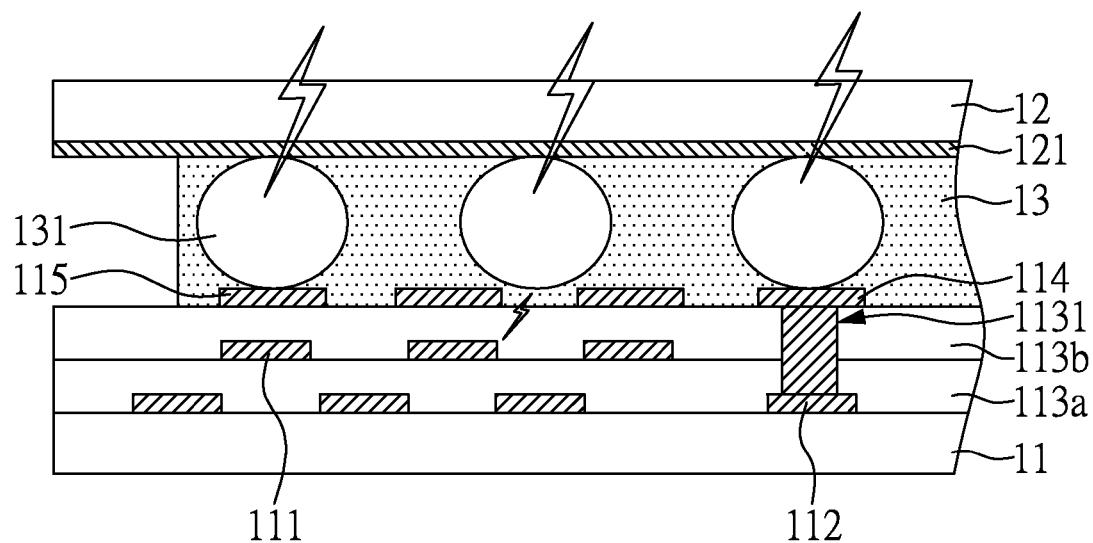
FIG. 5 is a perspective view showing a part of a border region of a display panel according to Embodiment 3 of the present invention.

FIG. 5 is a perspective view showing a part of a border region of a display panel in the present embodiment. The manufacturing process and the structure of the display panel of the present embodiment are identical to those illustrated in Embodiment 1, except that the first substrate 11 are sequentially laminated with the circuits 112, the insulating layer 113a, the circuits 111, the insulating layer 113b, and the electrode layer 114 as well as the conductive unit 115, and the electrode layer 114 is disposed on the insulating layer 113b and extends to a conductive via 1131 thereof to electrically connect to the circuits 112. Herein, the conductive unit 115 is completely overlapped with the circuits 111 to protect the circuits 111 from being damaged by the point discharge occurred at the conductive particles 131 during the electrostatic discharge test.

Comparative Embodiment

Figure 6:
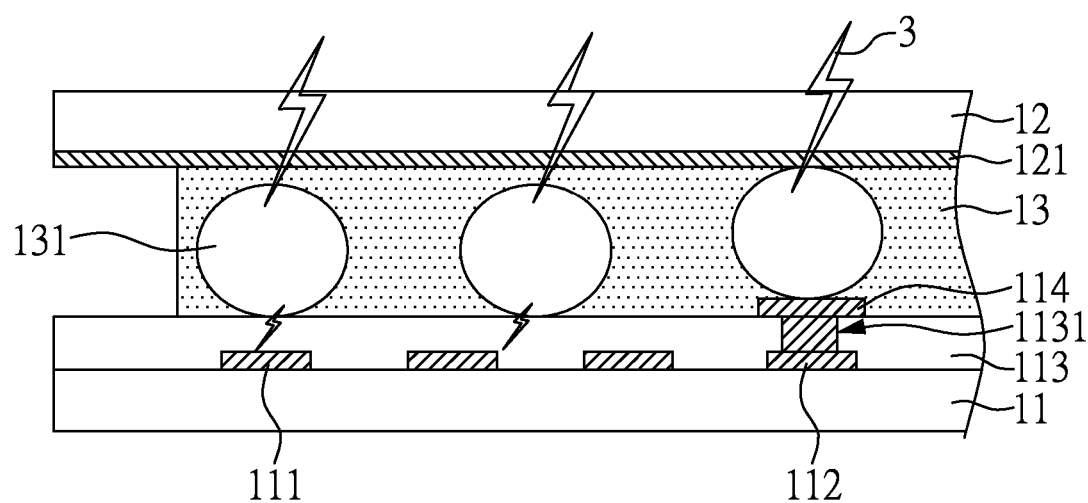
FIG. 6 is a perspective view showing a part of a border region of a display panel according to Comparative embodiment of the present invention.

FIG. 6 is a perspective view showing a part of a border region of a display panel in the present comparative embodiment. The manufacturing process and the structure of the display panel of the present comparative embodiment are identical to those illustrated in Embodiment 1, except that the display panel of the present comparative embodiment is not disposed with the conductive unit 115 of Embodiment 1 (as shown in FIG. 3). In this case, the conductive particles 131 in the sealant 13 can be considered as tiny conductors. Hence, during the electrostatic discharge test performed after the display panel of the present embodiment is obtained, point discharge may be occurred at the conductive particles 131 when static electricity is applied thereon, and the charges from the point discharge may damage the circuits 111 near the conductive particles 131 (especially, the most left circuits 111 in FIG. 6), resulting in the panel damage.

Except for the aforementioned display panels, the present invention further provides a display device, comprising: any one of the display panels illustrated in Embodiments 1 to 3.

In addition, the display device provided by the aforementioned embodiments of the present invention can be applied to any electronic device for displaying images, such as a mobile phone, a notebook, a camera, a video camera, a music player, a navigation system, or a television.

Although the present invention has been explained in relation to its preferred embodiment, it is to be understood that many other possible modifications and variations can be made without departing from the spirit and scope of the invention as hereinafter claimed.

What is claimed is:

1. A display panel, comprising:
   a first substrate comprising a display region and a border region surrounding the display region, wherein a plurality of circuits are disposed on the border region, and an insulating layer is disposed on the first substrate and covers the circuits;
   a second substrate;
   a conductive unit disposed on the insulating layer, and partially overlapping with the circuits; and
   a sealant disposed between the first substrate and the second substrate, and covering the conductive unit, wherein the sealant comprises a plurality of conductive particles dispersed therein.

2. The display panel as claimed in claim 1, wherein the conductive unit is electrically insulated with the circuits.

3. The display panel as claimed in claim 1, wherein the conductive unit covered by the sealant completely overlaps with the circuits.

4. The display panel as claimed in claim 1, wherein the conductive unit is a patterned conductive layer, and the patterned conductive layer is disposed to be corresponded to the circuits.

5. The display panel as claimed in claim 1, wherein the conductive unit is made of a transparent conductive oxide.

6. The display panel as claimed in claim 1, wherein the conductive particles are respectively a metal particle.

7. The display panel as claimed in claim 6, wherein the metal particle is an Au ball or an Ag ball.

8. The display panel as claimed in claim 1, wherein a thickness of the insulating layer is 200-450 nm.

9. The display panel as claimed in claim 1, wherein parts of the conductive particles directly contact with the conductive unit.

10. The display panel as claimed in claim 1, wherein the conductive unit is not disposed on the display region.

11. The display panel as claimed in claim 1, wherein the insulating layer has a contact via penetrating through the insulating layer.

12. A display device, comprising a display panel comprising:
- a first substrate comprising a display region and a border region surrounding the display region, wherein a plurality of circuits are disposed on the border region, and an insulating layer is disposed on the first substrate and covers the circuits;
- a second substrate;
- a conductive unit disposed on the insulating layer, and partially overlapping with the circuits; and
- a sealant disposed between the first substrate and the second substrate, and covering the conductive unit, wherein the sealant comprises a plurality of conductive particles dispersed therein.

\* \* \* \* \*